US00RE43817E

(19) United States
(12) Reissued Patent
Krisko et al.

(10) Patent Number: US RE43,817 E
(45) Date of Reissued Patent: Nov. 20, 2012

(54) LOW-MAINTENANCE COATINGS

(75) Inventors: Annette J. Krisko, Sauk City, WI (US); Kari B. Myli, Sauk City, WI (US); Gary L. Pfaff, Cazenovia, WI (US); James E. Brownlee, Northfield, MN (US)

(73) Assignee: Cardinal CG Company, Eden Prairie, MN (US)

(21) Appl. No.: 13/271,794

(22) Filed: Oct. 12, 2011

Related U.S. Patent Documents

Reissue of:
(64) Patent No.: 7,713,632
Issued: May 11, 2010
Appl. No.: 11/179,178
Filed: Jul. 12, 2005

U.S. Applications:
(60) Provisional application No. 60/659,491, filed on Mar. 7, 2005, provisional application No. 60/587,210, filed on Jul. 12, 2004.

(51) Int. Cl.
*B32B 9/00* (2006.01)
(52) U.S. Cl. ..... 428/432; 428/428; 428/701; 428/702
(58) Field of Classification Search ..... None
See application file for complete search history.

(56) References Cited

U.S. PATENT DOCUMENTS

| | | | |
|---|---|---|---|
| 1,256,818 | A | 2/1918 | Nile |
| 2,808,351 | A | 10/1952 | Colbert |
| 2,780,553 | A | 2/1957 | Pawlyk |
| 3,505,092 | A | 4/1970 | Ryan |
| 3,528,906 | A | 9/1970 | Cash, Jr. |
| 3,679,291 | A | 7/1972 | Apfel |
| 3,727,666 | A | 4/1973 | Vander Sluis |
| 3,829,197 | A | 8/1974 | Thelen |
| 3,840,451 | A | 10/1974 | Golyanov |
| 3,844,924 | A | 10/1974 | Cunningham |
| 3,852,098 | A | 12/1974 | Bloss |
| 3,854,796 | A | 12/1974 | Thelen |
| 3,911,579 | A | 10/1975 | Lane |
| 3,925,182 | A | 12/1975 | Carmichael |
| 3,934,961 | A | 1/1976 | Itoh |
| 3,968,018 | A | 7/1976 | Lane |
| 3,970,037 | A | 7/1976 | Sopko |
| 3,990,784 | A | 11/1976 | Gelber |

(Continued)

FOREIGN PATENT DOCUMENTS

| | | |
|---|---|---|
| CA | 2290999 | 5/1998 |

(Continued)

OTHER PUBLICATIONS

Anderson et al., "An Improved Photocatalyst of $TiO_2/SiO_2$ prepared by a Sol-Gel Synthesis", *J. Phys. Chem.*, 1995, 99, 9882-9885.

(Continued)

*Primary Examiner* — David R Sample
(74) *Attorney, Agent, or Firm* — Fredrikson & Byron, P.A.

(57) ABSTRACT

The invention provides a substrate bearing a low-maintenance coating. The coating includes two films: a first film comprising silica (e.g., silicon dioxide) and a second film comprising titania (e.g., titanium dioxide). Preferably, both films are provided within particular thickness ranges. The invention also provides methods of depositing such coatings.

22 Claims, 3 Drawing Sheets

U.S. PATENT DOCUMENTS

| | | | | |
|---|---|---|---|---|
| 4,012,119 | A | 3/1977 | Adams | |
| 4,029,566 | A | 6/1977 | Brandmair | |
| 4,045,125 | A | 8/1977 | Farges | |
| 4,052,520 | A | 10/1977 | Chang | |
| 4,060,660 | A | 11/1977 | Carlson | |
| 4,107,350 | A | 8/1978 | Berg | |
| 4,130,672 | A | 12/1978 | Onoki | |
| 4,166,018 | A | 8/1979 | Chapin | |
| 4,194,022 | A | 3/1980 | Gillery | |
| 4,212,663 | A | 7/1980 | Aslami | |
| 4,212,903 | A | 7/1980 | Schnell | |
| 4,214,014 | A | 7/1980 | Hofer | |
| 4,216,259 | A | 8/1980 | Groth | |
| 4,238,276 | A | 12/1980 | Kinugawa | |
| 4,252,629 | A | 2/1981 | Bewer | |
| 4,261,722 | A | 4/1981 | Novak | |
| 4,322,276 | A | 3/1982 | Meckel | |
| 4,331,526 | A | 5/1982 | Kuehnie | |
| 4,332,922 | A | 6/1982 | Kossmehl | |
| 4,336,119 | A | 6/1982 | Gillery | |
| 4,351,861 | A | 9/1982 | Henery | |
| 4,356,073 | A | 10/1982 | McKelvey | |
| 4,377,613 | A | 3/1983 | Gordon | |
| 4,422,916 | A | 12/1983 | McKelvey | |
| 4,422,917 | A | 12/1983 | Hayfield | |
| 4,440,822 | A | 4/1984 | Gordon | |
| 4,465,575 | A | 8/1984 | Love | |
| 4,466,258 | A | 8/1984 | Sando | |
| 4,466,877 | A | 8/1984 | McKelvey | |
| 4,485,146 | A | 11/1984 | Mizuhashi | |
| 4,486,286 | A | 12/1984 | Lewin | |
| 4,503,125 | A | 3/1985 | Nelson | |
| 4,504,519 | A | 3/1985 | Zelez | |
| 4,556,599 | A | 12/1985 | Sato | |
| 4,568,622 | A | 2/1986 | Minami | |
| 4,569,738 | A | 2/1986 | Kieser | |
| 4,571,350 | A | 2/1986 | Parker | |
| 4,576,864 | A | 3/1986 | Krautter | |
| 4,661,409 | A | 4/1987 | Kieser | |
| 4,663,234 | A | 5/1987 | Bouton | |
| 4,673,475 | A | 6/1987 | Windischmann | |
| 4,692,428 | A | 9/1987 | Murrell | |
| 4,704,339 | A | 11/1987 | Green | |
| 4,713,311 | A | 12/1987 | Senske | |
| 4,717,622 | A | 1/1988 | Kurokawa | |
| 4,725,345 | A | 2/1988 | Sakamoto | |
| 4,728,529 | A | 3/1988 | Etzkorn | |
| 4,732,454 | A | 3/1988 | Saito | |
| 4,737,252 | A | 4/1988 | Hoffman | |
| 4,769,291 | A | 9/1988 | Belkind | |
| 4,777,090 | A | 10/1988 | Ovshinsky | |
| 4,780,334 | A | 10/1988 | Ackerman | |
| 4,798,660 | A | 1/1989 | Ermer | |
| 4,814,056 | A | 3/1989 | Welty | |
| 4,816,127 | A | 3/1989 | Eltouky | |
| 4,834,857 | A | 5/1989 | Gillery | |
| 4,838,935 | A | 6/1989 | Dunlop | |
| 4,849,081 | A | 7/1989 | Ross | |
| 4,851,095 | A | 7/1989 | Scobey | |
| 4,854,670 | A | 8/1989 | Mellor | |
| 4,859,493 | A | 8/1989 | Lemelson | |
| 4,861,680 | A | 8/1989 | Meyer | |
| 4,882,827 | A | 11/1989 | Kusumi | |
| 4,883,574 | A | 11/1989 | Dos Santos | |
| 4,894,133 | A | 1/1990 | Hedgcoth | |
| 4,902,580 | A | 2/1990 | Gillery | |
| 4,915,977 | A | 4/1990 | Okamoto | |
| 4,919,778 | A | 4/1990 | Dietrich | |
| 4,931,213 | A | 6/1990 | Guajardo | 340/664 |
| 4,931,315 | A | 6/1990 | Mellor | |
| 4,931,778 | A | 6/1990 | Guajardo | |
| 4,940,636 | A | 7/1990 | Brock | |
| 4,952,430 | A | 8/1990 | Bowser | |
| 4,954,465 | A | 9/1990 | Kawashima | |
| 4,961,958 | A | 10/1990 | Desphandey | |
| 4,963,240 | A | 10/1990 | Fukasawa | |
| 4,981,568 | A | 1/1991 | Taranko | |
| 4,990,234 | A | 2/1991 | Szczyrbowski | |
| 4,995,893 | A | 2/1991 | Jenkins | |
| 4,997,576 | A | 3/1991 | Heller | |
| 5,006,248 | A | 4/1991 | Anderson | |
| 5,008,002 | A | 4/1991 | Uno | |
| 5,020,288 | A | 6/1991 | Swensen | |
| 5,026,415 | A | 6/1991 | Yamamoto | |
| 5,032,421 | A | 7/1991 | Sarma | |
| 5,035,784 | A | 7/1991 | Anderson | |
| 5,047,131 | A | 9/1991 | Wolfe | |
| 5,071,206 | A | 12/1991 | Hood | |
| 5,073,241 | A | 12/1991 | Watanabe | |
| 5,073,450 | A | 12/1991 | Nietering | |
| 5,073,451 | A | 12/1991 | Iida | |
| 5,090,985 | A | 2/1992 | Soubeyrand | |
| 5,104,539 | A | 4/1992 | Anderson | |
| 5,105,310 | A | 4/1992 | Dickey | |
| 5,106,671 | A | 4/1992 | Amberger | |
| 5,107,643 | A | 4/1992 | Swensen | |
| 5,108,574 | A | 4/1992 | Kirs | |
| 5,110,637 | A | 5/1992 | Ando | |
| 5,126,218 | A | 6/1992 | Clarke | |
| RE34,035 | E | 8/1992 | Dimigen | |
| 5,139,633 | A | 8/1992 | Kashida | |
| 5,160,534 | A | 11/1992 | Hiraki | |
| 5,165,972 | A | 11/1992 | Porter | |
| 5,168,003 | A | 12/1992 | Proscia | |
| 5,171,414 | A | 12/1992 | Amberger | |
| 5,176,897 | A | 1/1993 | Lester | |
| 5,179,468 | A | 1/1993 | Gasloli | |
| 5,190,807 | A | 3/1993 | Kimock | |
| 5,194,990 | A | 3/1993 | Boulos | |
| 5,196,400 | A | 3/1993 | Chen | |
| 5,201,926 | A | 4/1993 | Szczyrbowski | |
| 5,209,996 | A | 5/1993 | Kashida | |
| 5,211,759 | A | 5/1993 | Zimmermann | |
| 5,234,487 | A | 8/1993 | Wickersham | |
| 5,245,468 | A | 9/1993 | Demiryont | |
| 5,254,392 | A | 10/1993 | Burns | |
| 5,284,539 | A | 2/1994 | McKernan | |
| 5,286,524 | A | 2/1994 | Slutz | |
| 5,298,048 | A | 3/1994 | Lingle | |
| 5,298,338 | A | 3/1994 | Hiraki | |
| 5,302,449 | A | 4/1994 | Eby | |
| 5,306,547 | A | 4/1994 | Hood | |
| 5,306,569 | A | 4/1994 | Hiraki | |
| 5,318,830 | A | 6/1994 | Takamatsu | |
| 5,338,422 | A | 8/1994 | Belkind | |
| 5,342,676 | A | 8/1994 | Zagdoun | |
| 5,346,600 | A | 9/1994 | Nieh | |
| 5,354,446 | A | 10/1994 | Kida | |
| 5,356,718 | A | 10/1994 | Athey | |
| 5,366,764 | A | 11/1994 | Sunthankar | |
| 5,378,527 | A | 1/1995 | Nakanishi | |
| 5,394,269 | A | 2/1995 | Takamatsu | |
| 5,397,050 | A | 3/1995 | Mueller | |
| 5,401,543 | A | 3/1995 | O'Neill | |
| 5,405,517 | A | 4/1995 | Lampkin | |
| 5,415,756 | A | 5/1995 | Wolfe | |
| 5,417,827 | A | 5/1995 | Finley | |
| 5,424,130 | A | 6/1995 | Nakanishi | |
| 5,453,459 | A | 9/1995 | Roberts | |
| 5,470,527 | A | 11/1995 | Yamanobe | |
| 5,470,661 | A | 11/1995 | Bailey | |
| 5,476,713 | A | 12/1995 | Abiko | |
| 5,482,602 | A | 1/1996 | Cooper | |
| 5,496,621 | A | 3/1996 | Makita | |
| 5,498,475 | A | 3/1996 | Takigawa | |
| 5,507,930 | A | 4/1996 | Yamashita | |
| 5,512,152 | A | 4/1996 | Schicht | |
| 5,513,039 | A | 4/1996 | Lu | |
| 5,514,485 | A | 5/1996 | Ando | |
| 5,520,996 | A | 5/1996 | Balian | |
| 5,525,406 | A | 6/1996 | Goodman | |
| 5,527,755 | A | 6/1996 | Wenski | |
| 5,529,631 | A | 6/1996 | Yoshikawa | |
| 5,552,180 | A | 9/1996 | Finley | |
| 5,558,751 | A | 9/1996 | Mahler | |
| 5,563,734 | A | 10/1996 | Wolfe | |
| 5,569,362 | A | 10/1996 | Lerbet | |

5,569,501 A 10/1996 Bailey
5,589,280 A 12/1996 Gibbons
5,593,784 A 1/1997 Chinzi
5,593,786 A 1/1997 Parker
5,594,585 A 1/1997 Komatsu
5,595,813 A 1/1997 Ogawa
5,595,825 A 1/1997 Guiselin
5,597,622 A 1/1997 Zoller
5,599,422 A 2/1997 Adams
5,605,609 A 2/1997 Ando
5,607,723 A 3/1997 Plano et al.
5,609,924 A 3/1997 McCurdy
5,611,899 A 3/1997 Maass
5,616,225 A 4/1997 Sieck
5,616,532 A 4/1997 Heller
5,618,388 A 4/1997 Seeser
5,618,590 A 4/1997 Naruse
5,620,572 A 4/1997 Bjornard
5,624,423 A 4/1997 Anjur
5,624,760 A 4/1997 Collins
5,633,208 A 5/1997 Ishikawa
5,635,287 A 6/1997 Balian
5,643,423 A 7/1997 Kimock
5,643,432 A 7/1997 Qiu
5,645,699 A 7/1997 Sieck
5,645,900 A 7/1997 Ong
5,669,144 A 9/1997 Hahn
5,674,625 A 10/1997 Takahashi
5,674,658 A 10/1997 Burberry
5,679,431 A 10/1997 Chen
5,679,978 A 10/1997 Kawahara
5,683,560 A 11/1997 Szczyrbowski
5,683,561 A 11/1997 Hollars
5,686,372 A 11/1997 Langford
5,698,262 A 12/1997 Soubeyrand
5,715,103 A 2/1998 Amano
5,719,705 A 2/1998 Machol
5,723,172 A 3/1998 Sherman
5,724,187 A 3/1998 Varaprasad
5,733,660 A 3/1998 Makita
5,733,669 A 3/1998 Veyhl
5,744,215 A 4/1998 Neuman
5,745,291 A 4/1998 Jenkinson
5,750,265 A 5/1998 Goodman
5,755,867 A 5/1998 Chikuni
5,762,674 A 6/1998 Maltby, Jr.
5,763,087 A 6/1998 Falabella
5,780,119 A 7/1998 Dearnaley
5,780,149 A 7/1998 McCurdy
5,780,380 A 7/1998 Endoh
5,789,040 A 8/1998 Martinu
5,811,191 A 9/1998 Neuman
5,812,405 A 9/1998 Meredith, Jr.
5,814,195 A 9/1998 Lehan
5,814,196 A 9/1998 Hollars
5,820,994 A 10/1998 Gotoh
5,827,490 A 10/1998 Jones
5,830,252 A 11/1998 Finley
5,830,327 A 11/1998 Kolenkow
5,830,332 A 11/1998 Babich
5,846,613 A 12/1998 Neuville
5,849,200 A 12/1998 Heller
5,853,866 A 12/1998 Watanabe
5,854,169 A 12/1998 Heller
5,854,708 A 12/1998 Komatsu
5,863,398 A 1/1999 Kardokus
5,866,199 A 2/1999 Swidler
5,866,260 A 2/1999 Adams, Jr.
5,869,187 A 2/1999 Nakamura
5,869,808 A 2/1999 Hyllberg
5,871,843 A 2/1999 Yoneda
5,873,203 A 2/1999 Thiel
5,874,701 A 2/1999 Watanabe
5,877,391 A 3/1999 Kanno
5,888,593 A 3/1999 Petrmichl
5,891,556 A 4/1999 Anderson
5,896,553 A 4/1999 Lo
5,897,957 A 4/1999 Goodman
5,935,716 A 8/1999 McCurdy
5,939,188 A 8/1999 Moncur
5,939,194 A 8/1999 Hashimoto
5,939,201 A 8/1999 Boire
5,948,538 A 9/1999 Brochot
5,961,843 A 10/1999 Hayakawa
5,962,115 A 10/1999 Zmelty
5,965,246 A 10/1999 Guiselin
5,968,328 A 10/1999 Teschner
5,972,184 A 10/1999 Hollars
5,981,426 A 11/1999 Langford
5,993,734 A 11/1999 Snowman
6,013,372 A 1/2000 Hayakawa
6,027,766 A 2/2000 Greenberg
6,037,289 A 3/2000 Chopin
6,040,939 A 3/2000 Demiryont
6,045,903 A 4/2000 Seino
6,046,403 A 4/2000 Yoshikawa
6,054,024 A 4/2000 Toyama
6,054,227 A 4/2000 Greenberg
6,068,914 A 5/2000 Boire
6,071,606 A 6/2000 Yamazaki
6,071,623 A 6/2000 Sugawara
6,074,981 A 6/2000 Tada
6,077,482 A 6/2000 Kanno
6,077,492 A 6/2000 Anpo
6,090,489 A 7/2000 Hayakawa
6,103,363 A 8/2000 Boire
6,114,043 A 9/2000 Joret
6,120,747 A 9/2000 Sugishima
6,124,044 A 9/2000 Swidler
6,139,803 A 10/2000 Watanabe
6,139,968 A 10/2000 Knapp
6,153,067 A 11/2000 Maishev
6,154,311 A 11/2000 Simmons
6,156,171 A 12/2000 Hollars
6,156,409 A 12/2000 Doushita
6,165,256 A 12/2000 Hayakawa
6,165,598 A 12/2000 Nelson
6,165,616 A 12/2000 Lemelson
6,171,659 B1 1/2001 Vanden Brande
6,179,971 B1 1/2001 Kittrell
6,179,972 B1 1/2001 Kittrell
6,191,062 B1 2/2001 Hayakawa
6,193,378 B1 2/2001 Tonar
6,193,856 B1 2/2001 Kida
6,194,346 B1 2/2001 Tada
6,197,101 B1 3/2001 Matsumura
6,210,750 B1 4/2001 Cho
6,210,779 B1 4/2001 Watanabe
6,228,480 B1 5/2001 Kimura
6,228,502 B1 5/2001 Saitoh
6,238,738 B1 5/2001 McCurdy
6,242,752 B1 6/2001 Soma
6,248,397 B1 6/2001 Ye
6,261,693 B1 7/2001 Veerasamy
6,270,633 B1 8/2001 Onaka
6,274,244 B1 8/2001 Finley
6,299,981 B1 10/2001 Azzopardi
6,319,326 B1 11/2001 Koh
6,326,079 B1 12/2001 Philippe
6,329,060 B1 12/2001 Barkac
6,329,925 B1 12/2001 Skiver
6,333,084 B1 12/2001 Woodard
6,334,938 B2 1/2002 Kida
6,335,479 B1 1/2002 Yamada
6,336,998 B1 1/2002 Wang
6,337,124 B1 1/2002 Anderson
6,346,174 B1 2/2002 Finley
6,350,397 B1 2/2002 Heikkila
6,352,755 B1 3/2002 Finley
6,354,109 B1 3/2002 Boire
6,362,121 B1 3/2002 Chopin
6,365,010 B1 4/2002 Hollars
6,365,014 B2 4/2002 Finley
6,368,664 B1 4/2002 Veerasamy
6,368,668 B1 4/2002 Kobayashi
6,379,746 B1 4/2002 Birch
6,379,776 B1 4/2002 Tada
6,387,844 B1 5/2002 Fujishima 6,403,686 B1 6/2002 Pickett
6,403,689 B1 6/2002 Pickett ..... 524/431
6,413,581 B1 7/2002 Greenberg
6,414,213 B2 7/2002 Ohmori
6,419,800 B2 7/2002 Anzaki
6,425,670 B1 7/2002 Komatsu
6,428,172 B1 8/2002 Hutzel
6,436,542 B1 8/2002 Ogino
6,440,278 B1 8/2002 Kida
6,447,123 B2 9/2002 Tonar
6,451,178 B2 9/2002 Szczyrbowski
6,461,686 B1 10/2002 Vanderstraeten
6,464,951 B1 10/2002 Kittrell
6,465,088 B1 10/2002 Talpaert
6,468,402 B1 10/2002 Vanderstraeten
6,468,403 B1 10/2002 Shimizu
6,468,428 B1 10/2002 Nishii
6,488,824 B1 12/2002 Hollars
6,500,690 B1 12/2002 Yamagishi
6,501,387 B2 12/2002 Skiver
6,511,587 B2 1/2003 Vanderstraeten
6,570,709 B2 5/2003 Katayama
6,576,344 B1 6/2003 Doushita
6,582,839 B1 6/2003 Yamamoto
6,596,664 B2 7/2003 Kittrell
6,635,155 B2 10/2003 Miyamura
6,660,365 B1 12/2003 Krisko
6,673,738 B2 1/2004 Ueda
6,677,063 B2 1/2004 Finley
6,679,978 B2 1/2004 Johnson
6,680,135 B2 1/2004 Boire
6,682,773 B2 1/2004 Medwick
6,716,323 B1 4/2004 Siddle
6,720,066 B2 4/2004 Talpaert
6,722,159 B2 4/2004 Greenberg
6,730,630 B2 5/2004 Okusako
6,733,889 B2 5/2004 Varanasi
6,743,343 B2 6/2004 Kida
6,743,749 B2 6/2004 Morikawa
6,761,984 B2 7/2004 Anzaki
6,770,321 B2 8/2004 Hukari
6,777,030 B2 8/2004 Veerasamy
6,777,091 B2 8/2004 Kijima
6,781,738 B2 8/2004 Kikuchi
6,787,199 B2 9/2004 Anpo
6,789,906 B2 9/2004 Tonar
6,794,065 B1 9/2004 Morikawa
6,800,182 B2 10/2004 Mitsui
6,800,183 B2 10/2004 Takahashi
6,800,354 B2 10/2004 Baumann
6,804,048 B2 10/2004 MacQuart
6,811,856 B2 11/2004 Nun
6,818,309 B1 11/2004 Talpaert
6,829,084 B2 12/2004 Takaki
6,830,785 B1 12/2004 Hayakawa
6,833,089 B1 12/2004 Kawahara
6,835,688 B2 12/2004 Morikawa
6,840,061 B1 1/2005 Hurst
6,846,556 B2 1/2005 Boire
6,869,644 B2 3/2005 Buhay
6,870,657 B1 3/2005 Fitzmaurice
6,872,441 B2 3/2005 Baumann
6,875,319 B2 4/2005 Nadaud
6,878,242 B2 4/2005 Wang
6,878,450 B2 4/2005 Anpo
6,881,701 B2 4/2005 Jacobs
6,890,656 B2 5/2005 Iacovangelo
6,908,698 B2 6/2005 Yoshida
6,908,881 B1 6/2005 Sugihara
6,916,542 B2 7/2005 Buhay
6,921,579 B2 7/2005 O'Ohaughnessy
6,929,862 B2 8/2005 Hurst
6,939,611 B2 9/2005 Fujishima
6,952,299 B1 10/2005 Fukazawa
6,954,240 B2 10/2005 Hamamoto
6,962,759 B2 11/2005 Buhay
6,964,731 B1 11/2005 Krisko
6,974,629 B1 12/2005 Krisko
6,997,570 B2 2/2006 Nakaho
7,005,188 B2 2/2006 Anderson
7,005,189 B1 2/2006 Tachibana
7,011,691 B2 3/2006 Abe
7,022,416 B2 4/2006 Teranishi
7,049,002 B2 5/2006 Greenberg
7,052,585 B2 5/2006 Veerasamy
7,060,643 B2 6/2006 Sanbayashi
7,096,692 B2 8/2006 Greenberg
7,118,936 B2 10/2006 Kobayashi
7,138,181 B2 11/2006 McCurdy
7,157,840 B2 1/2007 Fujishima
7,175,911 B2 2/2007 Zhou
7,179,527 B2 2/2007 Sato
7,195,821 B2 3/2007 Tixhon
7,198,699 B2 4/2007 Thomsen
7,211,513 B2 5/2007 Remington, Jr.
7,211,543 B2 5/2007 Nakabayashi
7,223,523 B2 5/2007 Boykin
7,232,615 B2 6/2007 Buhay
7,255,831 B2 8/2007 Wei
7,261,942 B2 8/2007 Andrews
7,264,741 B2 9/2007 Hartig
7,294,365 B2 11/2007 Hayakawa
7,294,404 B2 11/2007 Krisko
7,300,634 B2 11/2007 Yaniv
7,309,405 B2 12/2007 Cho
7,309,664 B1 12/2007 Marzolin
7,311,961 B2 12/2007 Finley
7,320,827 B2 1/2008 Fujisawa
7,323,249 B2 1/2008 Athey
7,348,054 B2 3/2008 Jacquiod
7,354,624 B2 4/2008 Millero
7,361,963 B2 4/2008 Ikadai
7,387,839 B2 6/2008 Gueneau
7,534,466 B2 5/2009 Hartig
7,604,865 B2 10/2009 Krisko
7,713,632 B2 5/2010 Krisko
2001/0007715 A1 7/2001 Toyoshima
2001/0016262 A1 8/2001 Toyoshima
2001/0030808 A1 10/2001 Komatsu
2002/0012779 A1 1/2002 Miyashita
2002/0014634 A1 2/2002 Koyama
2002/0016250 A1 2/2002 Hayakawa
2002/0028361 A1 3/2002 Boire
2002/0045073 A1 4/2002 Finley
2002/0046945 A1 4/2002 Hosokawa
2002/0071956 A1 6/2002 Boire
2002/0102352 A1 8/2002 Hartig
2002/0110638 A1 8/2002 Boire
2002/0119307 A1 8/2002 Boire
2002/0155265 A1 10/2002 Choi
2002/0155299 A1 10/2002 Harris
2002/0172775 A1 11/2002 Buhay
2002/0189938 A1 12/2002 Baldwin
2003/0038028 A1 2/2003 Schultheis
2003/0039843 A1 2/2003 Johnson
2003/0043464 A1 3/2003 Dannenberg
2003/0048538 A1 3/2003 Tonar
2003/0054177 A1 3/2003 Jin
2003/0064231 A1 4/2003 Hurst
2003/0096701 A1 5/2003 Fujishima
2003/0143437 A1 7/2003 Ohtsu
2003/0152780 A1 8/2003 Baumann
2003/0180547 A1 9/2003 Buhay
2003/0186089 A1 10/2003 Kikuchi
2003/0207028 A1 11/2003 Boire
2003/0215647 A1 11/2003 Yoshida
2003/0224620 A1 12/2003 Kools
2003/0235695 A1 12/2003 Greenberg
2003/0235720 A1 12/2003 Athey
2004/0005466 A1 1/2004 Arai
2004/0009356 A1 1/2004 Medwick
2004/0020761 A1 2/2004 Thomsen
2004/0032655 A1 2/2004 Kikuchi
2004/0043260 A1 3/2004 Nadaud
2004/0063320 A1 4/2004 Hollars
2004/0069623 A1 4/2004 Vanderstraeten
2004/0115362 A1 6/2004 Hartig
2004/0140198 A1 7/2004 Cho

| | | | |
|---|---|---|---|
| 2004/0146721 | A1 | 7/2004 | Hartig |
| 2004/0149307 | A1 | 8/2004 | Hartig |
| 2004/0163945 | A1 | 8/2004 | Hartig |
| 2004/0179978 | A1 | 9/2004 | Kobayashi |
| 2004/0180216 | A1 | 9/2004 | Veerasamy |
| 2004/0180220 | A1 | 9/2004 | Gueneau |
| 2004/0196580 | A1 | 10/2004 | Nakaho |
| 2004/0202890 | A1 | 10/2004 | Kutilek |
| 2004/0206024 | A1 | 10/2004 | Graf |
| 2004/0214010 | A1 | 10/2004 | Murata |
| 2004/0216487 | A1 | 11/2004 | Boire |
| 2004/0219348 | A1 | 11/2004 | Jacquiod |
| 2004/0241040 | A1 | 12/2004 | Wei |
| 2004/0241490 | A1 | 12/2004 | Finley |
| 2004/0247901 | A1 | 12/2004 | Suzuki |
| 2004/0248725 | A1 | 12/2004 | Hiraoka |
| 2004/0253382 | A1 | 12/2004 | De Bosscher |
| 2004/0253471 | A1 | 12/2004 | Thiel |
| 2005/0003672 | A1 | 1/2005 | Kools |
| 2005/0016835 | A1 | 1/2005 | Krisko |
| 2005/0019505 | A1 | 1/2005 | Hamamoto |
| 2005/0019700 | A1 | 1/2005 | Hayakawa |
| 2005/0020444 | A1 | 1/2005 | Hiraoka |
| 2005/0025982 | A1 | 2/2005 | Krisko |
| 2005/0031876 | A1 | 2/2005 | Lu |
| 2005/0042375 | A1 | 2/2005 | Minami |
| 2005/0044894 | A1 | 3/2005 | Nelson |
| 2005/0051422 | A1 | 3/2005 | Rietzel |
| 2005/0084688 | A1 | 4/2005 | Garrec |
| 2005/0106397 | A1 | 5/2005 | Krisko |
| 2005/0137084 | A1 | 6/2005 | Krisko |
| 2005/0191505 | A1 | 9/2005 | Akarsu |
| 2005/0191522 | A1 | 9/2005 | Anzaki |
| 2005/0221098 | A1 | 10/2005 | Azzopardi |
| 2005/0227008 | A1 | 10/2005 | Okada |
| 2005/0233893 | A1 | 10/2005 | Sakatani |
| 2005/0233899 | A1 | 10/2005 | Anzaki |
| 2005/0238861 | A1 | 10/2005 | Buhay |
| 2005/0244678 | A1 | 11/2005 | Arfsten |
| 2005/0245382 | A1 | 11/2005 | Iwahashi |
| 2005/0245383 | A1 | 11/2005 | Iwahashi |
| 2005/0247555 | A1 | 11/2005 | Thiel |
| 2005/0248824 | A1 | 11/2005 | Fukazawa |
| 2005/0252108 | A1 | 11/2005 | Sanderson |
| 2005/0258030 | A1 | 11/2005 | Finley |
| 2005/0266248 | A1 | 12/2005 | Millero |
| 2005/0272590 | A1 | 12/2005 | Iwahashi |
| 2006/0003545 | A1 | 1/2006 | Veerasamy |
| 2006/0011945 | A1 | 1/2006 | Spitzer-Keller |
| 2006/0014027 | A1 | 1/2006 | Oudard |
| 2006/0014050 | A1 | 1/2006 | Gueneau |
| 2006/0019104 | A1 | 1/2006 | Hurst |
| 2006/0029813 | A1 | 2/2006 | Kutilek |
| 2006/0031681 | A1 | 2/2006 | Smith |
| 2006/0032739 | A1 | 2/2006 | Ikeda |
| 2006/0051597 | A1 | 3/2006 | Anzaki |
| 2006/0055513 | A1 | 3/2006 | French |
| 2006/0057298 | A1 | 3/2006 | Krisko |
| 2006/0057401 | A1 | 3/2006 | Krisko |
| 2006/0070869 | A1 | 4/2006 | Krisko |
| 2006/0090996 | A1 | 5/2006 | Yaniv |
| 2006/0102465 | A1 | 5/2006 | Blondeel |
| 2006/0105103 | A1 | 5/2006 | Hartig |
| 2006/0107599 | A1 | 5/2006 | Luten |
| 2006/0110605 | A1 | 5/2006 | Luten |
| 2006/0118406 | A1 | 6/2006 | Delahoy |
| 2006/0121315 | A1 | 6/2006 | Myli |
| 2006/0127604 | A1 | 6/2006 | Ikadai |
| 2006/0134322 | A1 | 6/2006 | Harris |
| 2006/0134436 | A1 | 6/2006 | Maschwitz |
| 2006/0141290 | A1 | 6/2006 | Sheel |
| 2006/0152832 | A1 | 7/2006 | Aumercier |
| 2006/0159906 | A1 | 7/2006 | Messere |
| 2006/0165996 | A1 | 7/2006 | Veerasamy |
| 2006/0194066 | A1 | 8/2006 | Ye |
| 2006/0196765 | A1 | 9/2006 | Cheng |
| 2006/0201203 | A1 | 9/2006 | Labrousse |
| 2006/0210783 | A1 | 9/2006 | Seder |
| 2006/0210810 | A1 | 9/2006 | Harris |
| 2006/0225999 | A1 | 10/2006 | Fukawa |
| 2006/0228476 | A1 | 10/2006 | McCurdy |
| 2006/0234064 | A1 | 10/2006 | Baubet |
| 2006/0247125 | A1 | 11/2006 | Choi |
| 2006/0263610 | A1 | 11/2006 | Greenberg |
| 2006/0275612 | A1 | 12/2006 | Baubet |
| 2007/0025000 | A1 | 2/2007 | Lin |
| 2007/0029187 | A1 | 2/2007 | Krasnov |
| 2007/0029527 | A1 | 2/2007 | Mills |
| 2007/0030569 | A1 | 2/2007 | Lu |
| 2007/0031593 | A1 | 2/2007 | Krasnov |
| 2007/0031681 | A1 | 2/2007 | Anzaki |
| 2007/0031682 | A1 | 2/2007 | Krasnov |
| 2007/0042893 | A1 | 2/2007 | Koike |
| 2007/0065670 | A1 | 3/2007 | Varaprasad |
| 2007/0077406 | A1 | 4/2007 | Jacobs |
| 2007/0087187 | A1 | 4/2007 | Lu |
| 2007/0092734 | A1 | 4/2007 | Durandeau |
| 2007/0108043 | A1 | 5/2007 | Lu |
| 2007/0109543 | A1 | 5/2007 | Hoffman |
| 2007/0111012 | A1 | 5/2007 | Rimmer |
| 2007/0116966 | A1 | 5/2007 | Mellott |
| 2007/0116967 | A1 | 5/2007 | Medwick |
| 2007/0129248 | A1 | 6/2007 | Labrousse |
| 2007/0134501 | A1 | 6/2007 | McMaster |
| 2007/0137673 | A1 | 6/2007 | Boykin |
| 2007/0148064 | A1 | 6/2007 | Labrousse |
| 2007/0184291 | A1 | 8/2007 | Harris |
| 2007/0196563 | A1 | 8/2007 | Wuwen |
| 2007/0218264 | A1 | 9/2007 | Gueneau |
| 2007/0218265 | A1 | 9/2007 | Harris |
| 2007/0218311 | A1 | 9/2007 | O'Shaughnessy |
| 2007/0224357 | A1 | 9/2007 | Buhay |
| 2007/0231501 | A1 | 10/2007 | Finley |
| 2007/0237968 | A1 | 10/2007 | Kijima |
| 2007/0254163 | A1 | 11/2007 | Veerasamy |
| 2007/0254164 | A1 | 11/2007 | Veerasamy |
| 2007/0264494 | A1 | 11/2007 | Krisko |
| 2007/0275252 | A1 | 11/2007 | Krasnov |
| 2007/0275253 | A1 | 11/2007 | Thiel |
| 2008/0011408 | A1 | 1/2008 | Maschwitz |
| 2008/0014349 | A1 | 1/2008 | Otani |
| 2008/0026161 | A1 | 1/2008 | Frings |
| 2008/0115471 | A1 | 5/2008 | Labrousse |
| 2008/0119352 | A1 | 5/2008 | Kitaguchi |
| 2008/0124460 | A1 | 5/2008 | Athey |
| 2008/0188370 | A1 | 8/2008 | Vormberg |

FOREIGN PATENT DOCUMENTS

| | | |
|---|---|---|
| DE | 39 06 453 | 9/1990 |
| DE | 43 13 284 | 10/1994 |
| DE | 19736925 | 3/1998 |
| DE | 19644752 | 4/1998 |
| DE | 19831610 | 1/1999 |
| DE | 10100221 | 7/2001 |
| DE | 10100223 | 7/2001 |
| EP | 0 207 646 | 1/1987 |
| EP | 0 470 379 | 2/1992 |
| EP | 0 470 379 A | 2/1992 |
| EP | 0 279 550 | 4/1993 |
| EP | 0 369 581 | 12/1993 |
| EP | 0 574 119 | 12/1993 |
| EP | 0 590 477 | 4/1994 |
| EP | 0 601 928 | 6/1994 |
| EP | 0 611 733 | 8/1994 |
| EP | 0 515 847 | 2/1995 |
| EP | 0 515 847 B1 | 2/1995 |
| EP | 0 636 702 | 2/1995 |
| EP | 0 637 572 | 2/1995 |
| EP | 0 639 655 | 2/1995 |
| EP | 0 657 562 | 6/1995 |
| EP | 0 689 096 | 12/1995 |
| EP | 0 689 096 A | 12/1995 |
| EP | 0 689 962 | 1/1996 |
| EP | 0 689 962 A | 1/1996 |
| EP | 0 737 513 | 10/1996 |
| EP | 0 328 257 | 4/1997 |
| EP | 0 328 257 A | 4/1997 |
| EP | 0 787 696 | 8/1997 |

| | | | |
|---|---|---|---|
| EP | 0 820 967 | | 1/1998 |
| EP | 0 820 967 | A | 1/1998 |
| EP | 0 771 766 | | 9/1998 |
| EP | 0 870 530 | | 10/1998 |
| EP | 0 753 882 | | 11/1998 |
| EP | 0 884 288 | | 12/1998 |
| EP | 0 799 255 | | 2/1999 |
| EP | 0 901 991 | | 3/1999 |
| EP | 0 345 045 | | 1/2000 |
| EP | 0 838 535 | | 2/2000 |
| EP | 0 850 203 | | 1/2001 |
| EP | 1 066 878 | | 1/2001 |
| EP | 0 850 204 | | 12/2001 |
| EP | 1 179 515 | | 2/2002 |
| EP | 0 944 557 | | 11/2002 |
| EP | 1 254 870 | | 11/2002 |
| EP | 0 737 513 | | 9/2003 |
| EP | 0 887 104 | | 11/2003 |
| EP | 1 046 727 | | 11/2003 |
| EP | 1 375 444 | | 1/2004 |
| EP | 1 411 386 | | 4/2004 |
| EP | 1 074 525 | | 9/2004 |
| EP | 1 466 665 | | 10/2004 |
| EP | 1 466 665 | A | 10/2004 |
| EP | 1 500 634 | | 1/2005 |
| EP | 1 518 836 | | 3/2005 |
| EP | 1 640 149 | | 3/2006 |
| EP | 0 816 466 | | 5/2006 |
| EP | 1 506 143 | | 5/2006 |
| FR | 2699164 | | 2/1995 |
| FR | 2738812 | | 3/1997 |
| FR | 2738813 | | 3/1997 |
| FR | 2738836 | | 3/1997 |
| FR | 2800731 | | 5/2001 |
| FR | 2814094 | | 3/2002 |
| FR | 2838734 | | 10/2003 |
| FR | 2838735 | | 10/2003 |
| FR | 2857885 | | 1/2005 |
| FR | 2861385 | | 4/2005 |
| FR | 2861386 | | 4/2005 |
| FR | 2869897 | | 11/2005 |
| FR | 2884147 | | 10/2006 |
| GB | 0232680 | | 4/1925 |
| GB | 1231280 | | 5/1971 |
| GB | 1426906 | | 3/1976 |
| GB | 1438462 | | 6/1976 |
| GB | 2028376 | | 3/1980 |
| GB | 1595061 | | 8/1981 |
| GB | 2201428 | | 2/1988 |
| GB | 2302102 | | 1/1997 |
| GB | 2316687 | | 8/1997 |
| GB | 2327428 | | 7/1998 |
| JP | 57-140339 | | 8/1982 |
| JP | 57-140339 | A | 8/1982 |
| JP | 60-081048 | | 5/1985 |
| JP | 60081048 | A | 5/1985 |
| JP | 61-091042 | | 5/1986 |
| JP | 61-091042 | A | 5/1986 |
| JP | 62-161945 | | 7/1987 |
| JP | 62-161945 | A | 7/1987 |
| JP | 01-014129 | | 1/1989 |
| JP | 01-014129 | A | 1/1989 |
| JP | 01-118807 | | 5/1989 |
| JP | 01-118807 | A | 5/1989 |
| JP | 3-122274 | | 5/1991 |
| JP | 3-122274 | A | 5/1991 |
| JP | 3-187039 | | 8/1991 |
| JP | 3-187039 | A | 8/1991 |
| JP | 3-193872 | | 8/1991 |
| JP | 3-193872 | A | 8/1991 |
| JP | 4-276066 | | 10/1992 |
| JP | 5-214525 | | 8/1993 |
| JP | 6-330297 | | 11/1994 |
| JP | 7-149545 | | 6/1995 |
| JP | 7-149545 | A | 6/1995 |
| JP | 7-215074 | | 8/1995 |
| JP | 7-215074 | A | 8/1995 |
| JP | 7-233469 | | 9/1995 |
| JP | 7-233469 | A | 9/1995 |
| JP | 7-508491 | | 9/1995 |
| JP | 7-508491 | A | 9/1995 |
| JP | 7-315874 | | 12/1995 |
| JP | 7-315874 | A | 12/1995 |
| JP | 7-315889 | | 12/1995 |
| JP | 7-315889 | A | 12/1995 |
| JP | 8-011631 | | 1/1996 |
| JP | 8-011631 | A | 1/1996 |
| JP | 8-012378 | | 1/1996 |
| JP | 8-012378 | A | 1/1996 |
| JP | 8-109043 | | 4/1996 |
| JP | 8-109043 | A | 4/1996 |
| JP | 8-134638 | | 5/1996 |
| JP | 8-134638 | A | 5/1996 |
| JP | 8-158048 | | 6/1996 |
| JP | 8-227006 | | 9/1996 |
| JP | 8-227006 | A | 9/1996 |
| JP | 9-189801 | | 7/1997 |
| JP | 9-189801 | A | 7/1997 |
| JP | 9-202651 | | 8/1997 |
| JP | 9-202651 | A | 8/1997 |
| JP | 9-249967 | | 9/1997 |
| JP | 9-249967 | A | 9/1997 |
| JP | 10-36144 | | 2/1998 |
| JP | 10-36144 | A | 2/1998 |
| JP | 10-048805 | | 2/1998 |
| JP | 10-048805 | A | 2/1998 |
| JP | 10-278165 | | 10/1998 |
| JP | 11-095014 | | 4/1999 |
| JP | 11-095014 | A | 4/1999 |
| JP | 11-302038 | | 11/1999 |
| JP | 2000-094569 | | 4/2000 |
| JP | 2003-311157 | | 11/2003 |
| JP | 2005-213585 | | 8/2005 |
| JP | 2006-305527 | | 11/2006 |
| WO | WO 87/06626 | | 11/1987 |
| WO | WO 89/10430 | | 11/1989 |
| WO | WO 92/17621 | | 10/1992 |
| WO | WO 92/17621 | A | 10/1992 |
| WO | WO 96/25534 | | 8/1996 |
| WO | WO 97/03763 | | 2/1997 |
| WO | WO 97/07066 | | 2/1997 |
| WO | WO 97/07069 | | 2/1997 |
| WO | WO 97/08359 | | 3/1997 |
| WO | WO 97/10185 | | 3/1997 |
| WO | WO 97/10186 | | 3/1997 |
| WO | WO 97/11916 | | 4/1997 |
| WO | WO 97/15499 | | 5/1997 |
| WO | WO 97/25201 | | 7/1997 |
| WO | WO 97/37801 | | 10/1997 |
| WO | WO 97/37946 | | 10/1997 |
| WO | WO 97/42351 | | 11/1997 |
| WO | WO 97/42357 | | 11/1997 |
| WO | WO 98/06675 | | 2/1998 |
| WO | WO 98/23549 | | 6/1998 |
| WO | WO 98/25700 | | 6/1998 |
| WO | WO 99/11896 | | 3/1999 |
| WO | WO 99/44954 | | 9/1999 |
| WO | WO 00/13257 | | 3/2000 |
| WO | WO 00/15571 | | 3/2000 |
| WO | WO 00/27771 | | 5/2000 |
| WO | WO 00/37376 | | 6/2000 |
| WO | WO 00/37377 | | 6/2000 |
| WO | WO 00/40402 | | 7/2000 |
| WO | WO 00/50354 | | 8/2000 |
| WO | 0075083 | | 12/2000 |
| WO | WO 00/75083 | | 12/2000 |
| WO | WO 00/75087 | | 12/2000 |
| WO | WO 01/02496 | | 1/2001 |
| WO | WO 01/32578 | | 5/2001 |
| WO | WO 01/68786 | | 9/2001 |
| WO | WO 01/71055 | | 9/2001 |
| WO | WO 03/12540 | | 2/2002 |
| WO | WO 03/012540 | | 2/2002 |
| WO | WO 02/24971 | | 3/2002 |
| WO | WO 02/40417 | | 5/2002 |
| WO | WO 02/49980 | | 6/2002 |
| WO | WO 02/085809 | | 10/2002 |
| WO | WO 03/009061 | | 1/2003 |

| | | |
|---|---|---|
| WO | WO 03006393 | 1/2003 |
| WO | WO 03/050056 | 6/2003 |
| WO | WO 03/053577 | 7/2003 |
| WO | WO 03/062166 | 7/2003 |
| WO | WO 03/068500 | 8/2003 |
| WO | WO 03/072849 | 9/2003 |
| WO | WO 03/080530 | 10/2003 |
| WO | WO 03/087002 | 10/2003 |
| WO | WO 03/087005 | 10/2003 |
| WO | WO 03/091471 | 11/2003 |
| WO | WO 03/093188 | 11/2003 |
| WO | WO 03/095385 | 11/2003 |
| WO | WO 03/095695 | 11/2003 |
| WO | WO 03/097549 | 11/2003 |
| WO | WO 03/106732 | 12/2003 |
| WO | WO 2004/013376 | 2/2004 |
| WO | WO 2004/034105 | 4/2004 |
| WO | WO 2004061151 | 7/2004 |
| WO | WO 2004/067464 | 8/2004 |
| WO | WO 2004/085699 | 10/2004 |
| WO | WO 2004/085701 | 10/2004 |
| WO | WO 2004/086104 | 10/2004 |
| WO | WO 2004/087985 | 10/2004 |
| WO | WO 2004/089836 | 10/2004 |
| WO | WO 2004/089838 | 10/2004 |
| WO | WO 2004/089839 | 10/2004 |
| WO | WO 2004/092088 | 10/2004 |
| WO | WO 2004/092089 | 10/2004 |
| WO | WO 2004/097063 | 11/2004 |
| WO | WO 2004/108618 | 12/2004 |
| WO | WO 2004/108619 | 12/2004 |
| WO | WO 2004/108846 | 12/2004 |
| WO | WO 2004/113064 | 12/2004 |
| WO | WO 2005/000758 | 1/2005 |
| WO | WO 2005/000759 | 1/2005 |
| WO | WO 2005/005337 | 1/2005 |
| WO | WO 2005/007286 | 1/2005 |
| WO | WO 2005/009914 | 2/2005 |
| WO | WO 2005/012593 | 2/2005 |
| WO | WO 2005/023723 | 3/2005 |
| WO | WO 2005/040056 | 5/2005 |
| WO | WO 2005/040058 | 5/2005 |
| WO | WO 2005/063646 | 7/2005 |
| WO | WO 2005/102952 | 11/2005 |
| WO | WO 2005/102953 | 11/2005 |
| WO | WO 2005/110937 | 11/2005 |
| WO | WO 2005/111257 | 11/2005 |
| WO | WO 2006/004169 | 1/2006 |
| WO | WO 2006/007062 | 1/2006 |
| WO | WO 2006/017311 | 2/2006 |
| WO | WO 2006/017349 | 2/2006 |
| WO | WO 2006/019995 | 2/2006 |
| WO | WO 2006/020477 | 2/2006 |
| WO | WO 2006/028729 | 3/2006 |
| WO | WO 2006/036605 | 4/2006 |
| WO | WO 2006/054954 | 5/2006 |
| WO | WO 2006/055513 | 5/2006 |
| WO | WO 2006/057830 | 6/2006 |
| WO | WO 2006/062902 | 6/2006 |
| WO | WO 2006/064059 | 6/2006 |
| WO | WO 2006/064060 | 6/2006 |
| WO | WO 2006/066101 | 6/2006 |
| WO | WO 2006/077839 | 7/2006 |
| WO | WO 2006/089964 | 8/2006 |
| WO | WO 2006/101994 | 9/2006 |
| WO | WO 2006/108985 | 10/2006 |
| WO | WO 2006/117345 | 11/2006 |
| WO | WO 2006/134335 | 12/2006 |
| WO | WO 2007/016127 | 2/2007 |
| WO | WO 2007/018974 | 2/2007 |
| WO | WO 2007/018975 | 2/2007 |
| WO | WO 2007/045805 | 4/2007 |
| WO | WO 2007/080428 | 7/2007 |
| WO | WO 2007/092511 | 8/2007 |
| WO | WO 2007/093823 | 8/2007 |
| WO | WO 2007/096461 | 8/2007 |
| WO | WO 2007/110482 | 10/2007 |
| WO | WO 2007/121211 | 10/2007 |
| WO | WO 2007/121215 | 10/2007 |
| WO | WO 2007/127060 | 11/2007 |
| WO | WO 2007/130140 | 11/2007 |

OTHER PUBLICATIONS

Anderson et al., "Improved Photocatalytic Activity and Characterization of Mixed $TiO_2/SiO_2$ and $TiO_2/Al_2O_3$ Materials", *J. Phys. Chem.*, 1997, 101, 2611-2616.

Ang et al., "Deposition of high stability thin film ternary alloy resistors by sputtering," In: International conf. On Vacuum Metallurgy, 4th, Tokyo, Japan Jun. 4-8, 1973.

U.S. Appl. No. 11/273,979 Non Final Office Action mailed Jun. 16, 2008, 9 pgs.

U.S. Appl. No. 11/273,979 Response to Non Final Office Action filed Dec. 16, 2008, 15 pgs.

Bell et al., "Electrochromism in sol-gel deposited $TiO_2$ films," Proceedings SPIE—The International Society for Optical Engineering, vol. 2255, Apr. 18-22, 1994.

Brat et al., "The Influence of Tungsten-10Wt% Titanium Sputtering Target Purity and Density on VLSI Applications," 2nd ASM International™ Electronic Materials and Processing Congress (Apr. 24-28, 1989, Philadelphia, PA).

Chen Wen-mei et al, "The Effect of $SiO_2$ Additive on Superhydrophilic Property of $TiO_2$-$SiO_2$ Thin Film by Sol-gel Method", *Journal of Wuhan University of Technology-Mater. Sci. Ed.* (Sep. 2001), vol. 16, No. 3, 30-33.

Creighton, "Non-Selective Tungsten CVD Using Tungsten Hezxacarbonyl," Sandia National Laboratories, Albuquerque, NM, 1987.

de Tacconi et al., "Nanoporous $TiO_2$ and $WO_3$ Films by Anodization of Titanium and Tungsten Substrates: Influence of process Variables on Morphology and Photoelectrochemical Response," J. Phys. Chem B 2006, 110, pp. 25347-25355.

Derwent Abstract 007612002 (Abstract of JP 879697), (1988).

Diesburg et al., "Low Mobile Ion Contamination From Sputtered High Purity Tungsten," 12th International Plansee Seminar, 1973, 1989, pp. 371-378.

Enesca et al., "Novel Approach of $TiO_2/WO_3$ for Water Splitting," 20th European photovoltaic Solar Energy Conference, Jun. 6-10, 2005, pp. 262-265.

Gao et al., "Great Enhancement of Photocatalytic Activity of Nitrogen-Doped Titania by Coupling with Tungsten Ozxide," J. Phys. Chem B 2006, 110, pp. 14391-14397.

Göttsche et al., "Electrochromic mixed $Wo_3$—$TiO_2$ thin films produced by sputtering and the sol-gel technique: a comparison," Solar Energy Materials and Solar Cells 31 (1993) pp. 415-428.

Guan et al, "Enhanced effect and mechanism of $SiO_2$ addition in super-hydrophilic property of $TiO_2$ films" *Surf. And Coating Tech 173* (2003) pp. 219-223.

Guan, "Hydrophilic property of $TiO_2/SiO_2$ mixing films" *Trans. Nonferrous Met. Soc. China* (2004), vol. 14, No. 2, pp. 251-254.

Guan, "Relationship between photocatalytic activity, hydrophilicity and self-cleaning effect of $TiO_2/SiO_2$ films" *Surf. And Coating Tech 191* (2005) pp. 155-160.

Gusev et al., "Sputtering of tungsten, tungsten oxide, and tungsten—carbon mixed layers by deuterium ions in the threshold energy region," Tech Phys. 44 (9), Sep. 1999, pp. 1123-1127.

Hamelmann et al., "Metal oxide/silicon oxide multilayer with smooth interfaces produced by in situ controlled plasma-enhanced MOCVD," Thin Solid Films 358 (2000), pp. 90-93.

Hashimoto et al., "Lifetime of Electrochromism of Amorphous$WO_3$-$TiO_2$ thin Films," J. Electrochem. Soc., vol. 138, No. 8, Aug. 1991, pp. 2403-2408.

Herrera et al., "Synthesis, characterization, and catalytic function of novel highly dispersed tungsten oxide catalysts on mesoporous silica," J. Catalysis 239 (2006), pp. 200-211.

Higashimoto et al., "Photoelectrochemical properties of hybrid $WO_3TiO_2$ electrode. Effect of structures of $WO_3$ on charge separation," Thin Solid Films 503 (2006), pp. 201-206.

Hodgson et al., "Photocatalytic Reactor Systems with Tungsten Oxide-Modified Titanium Dioxide for Indoor Air Applications," $11^{th}$ Conference on $TiO_2$ Photocatalysis: fundamentals & Applications (Sep. 25-28, 2006, Pittsburgh, PA).
Ingo et al., "XPS studies of $SiO_2$-$TiO_2$ powders prepared by sol-gel process", *Appl. Surf. Sci.* 1993, 70/71A, pp. 230-234.
Irie et al., "Interfacial structure dependence of layered $TiO_2/Wo_3$ thin films on the photoinduced hydrophilic property," Vacuum 74 (2004), pp. 625-629.
Jossen et al., "Thermal stability and catalytic activity of flame-made silica-vanadia-tungsten oxide-titania,", App. Catalysis B: Environmental 69 (2007), pp. 181-188.
Kanou, "Application of High Purity W for VLSI Sputtering Targets," 7th International Tungsten Symposium, Sep. 1996, pp. 410-418.
Keller et al., "Photocatalytic oxidation of butyl acetate in vapor phase on $TiO_2$, $Pt/TiO_2$ and $WO_3/TiO_2$ catalysts," Journal of Catalysis 215 (2003), pp. 129-138.
Kobayashi et al., "$V_2O_5$-$WO_3/TiO_2$-$SiO_2$-$SO_4^{2-}$ catalysts: Influence of active components and supports on activities in the selective catalytic reduction of NO by $NH_3$ and in the oxidation of $SO_2$" *App. Cat. B: Enviro 63*. (2006), pp. 104-113.
Kobayashi et al., "$V_2O_5$-$WO_3/TiO_2$-$SiO_2$-$SO_4^{2-}$catalysts: Influence of active components and supports on activities in the selective catalytic reduction of NO by $NH_3$ and in the oxidation of $SO_2$," Applied Catalysis B: Environmental 63 (2006), pp. 104-113.
Lassaletta et al., "Spectroscopic Characterization of Quantum-Sized $TiO_2$ Supported on Silica: Influence of Size and $TiO_2$-$SiO_2$ Interface Composition", *J. Phys. Chem.*, 1995, 99, 484-1490.
Lo et al., "Influence of Target Structure on Film Stress in WTI Sputtering," Mat. Res. Soc. Symp. Proc. vol. 505, 1998, pp. 427-432.
Manfred Von Ardenne, "The Effects of Physics and Their Applications," Verlag Harri Deutsch, Thun and Frankfurt am Main, 1997, 4 pages.
Manfred Von Ardenne, "The Effects of Physics and Their Applications," Verlag Harri Deutsch, Thun and Frankfurt am Main, 1997, 7 pages (English Translation).
Matthews et al., "An Adsorption Water Purifier with in Situ Photocatalytic Regeneration", *J. Catal.* 1988, 113, pp. 549-555.
MikroElektronick—High-rate Sputtering System for Two-Sided Coating (HZS-04).
Minero et al., "Role of Adsorption in Photocatalyzed Reactions of Organic Molecules in Aqueous of $TiO_2$ Suspensions", *Langmuir*, 1992, 113, pp. 481-486.
Miyashita et al., "Spectrum response of the vacuum-deposited $SiO_2$/$TiO_2$ multilayer film with improved photo-catalytic activity", *Journal of Materials Science Letters*, 2001, 20, 2137-2140.
Miyashita, et al., "Enhanced Effect of Vacuum-deposited $SiO_2$ Overlayer on Photo-induced Hydrophilicity of $TiO_2$ Film", *Journal of Materials Science 36* (2001) p. 3877-3884.
Miyauchi et al., "A Highly Hydrophilic Thin Film Under 1 $\mu W/cm^2$ UV Illumination," Adv. Mater. 2000, 12, pp. 1923-1927.
Nakamura, et al., "Hydrophilic property of $SiO_2/TiO_2$ double layer films" *Photocatalytic Coatings, Panel Session*, pp. 345-350.
Niwa et al., Ammoxidation of Toluene Over $SiO_2$-$Al_2O_3$ $ZrO_2$-$SiO_2$ and $TiO_2$-$SiO_2$, *J. Catal.* 1981, 69, pp. 69-76.
Novotná, et al., "Photocatalytical $TiO_2/SiO_2$-PDMS layers on glass" *Photocatalytic Coatings, Panel Session*, pp. 383-387.
Obee et al., "A Kinetic Study of Photocatalytic Oxidation of VOCs on $WO_3$ Coated Titanium Dioxide," 11th Conference on $TiO_2$ Photocatalysis: fundamentals & Applications (Sep. 25-28, 2006, Pittsburgh, PA).
Ohsaki, et al., "Photocatalytic properties of $SnO_2/TiO_2$ multilayers" *Photocatalytic Coatings, Panel Session*, pp. 369-376.
Okimura et al., "Characteristics of rutile $TiO_2$ films prepared by R.F. magnetron sputtering at a low temperature," Thin Solid Films 281-282 (1996) pp. 427-430.
Ramana et al., "Structural Stability and Phase Transitions in $WO_3$ Thin Films," J. Phys Chem B (2006), pp. 10430-10435.
Ramirez-Del-Solar et al., "Effect of the Method of Preparation on the Texture of $TiO_2$-$SiO_2$ Gels", *J. Non-Cryst. Solids* 1990, 121, pp. 84-89.
Richardson et al., "Tungsten-Vanadium Oxide Sputtered Films for Electrochromic Devices," http://btech.lbl.gov/papers/42381.pdf.
Saeki et al., "The Photoelectrochemical Response of $TiO_2$-$Wo_3$ Mixed Oxide Films Prepared by Thermal Oxidation of Titanium Coated with Tungsten," J. Electrochem. Soc., vol. 143, No. 7, Jul. 1996, pp. 2226-2229.
Salvado et al., "$TiO_2$-$SiO_2$ glasses prepared by the alkoxide route", *J. Non-Cryst. Solids* 1992, 147/148, pp. 256-261.
Satoh et al., "Sol-gel-derived binary silica glasses with high refractive index", *J. Non-Cryst. Solids* 1992, 146, pp. 121-128.
Schiller et al., "Influence of Deposition Parameters on the Optical and Structural Properties of $TiO_2$ Films Produced by Reactive D.C. Plasmetron Sputtering," Thin Solid Films 83 (1981), pp. 239-245.
Schintlmeister et al., "Optical Coatings ($nb_2O_5$, $Ta_2O_5$ and $WO_3$) for LAC-applications Obtained by DC Quaslreactive magnetron Sputtering of Ceramic Sputtering Targets," *46th Annual Technical Conference Proceedings—Soc. Of Vacuum Coaters*, May 3-8, 2003, pp. 296-301.
Schraml-Marth et al., "Porous silica gels and $TiO_2$-$SiO_2$ mixed oxides prepared via the sol-gel process: characterization by spectroscopic techniques", *J. Non-Cryst. Solids* 1992, 143, pp. 93-111.
Schwarz et al., Thermal material spraying—an alternative technique for the production of special purpose sputtering targets—abstract.
Shen et al., "A new method to prepare tungsten and nitrogen co-doped titanium dioxide and its excellent photocatalytic activities irradiated by visible light," 11th Conference on $TiO_2$ Photocatalysis: fundamentals & Applications (Sep. 25-28, 2006, Pittsburgh, PA).
Shibata, K., et al., "Acidic Properties of Binary Metal Oxides", *Bull. Chem. Soc. Jpn.* 1973, 46, pp. 2985-2988.
Shiyanovskaya et al., "Biocomponent $WO_3/TiO_2$ Films as Photoelectrodes," J. Electrochemical Soc. 146 (1999), pp. 243-249.
Sinel'nikova et al., "Interaction of a Mixture of Oxides of Tungsten and Silicon With Carbon," Soviet Powder Metallurgy and Metal Ceramics, vol. 29, No. 3(327), Mar. 1990, pp. 234-236.
Song et al., "Efficient degradation of organic pollutant with $Wo_x$ modified nano $TiO_2$ under visible irradiation," J. of Photochemistry and Photobiology A: Chemistry 181 (2006), pp. 421-428.
Staffler et al, "Advanced Coating Technology Based Upon Sputtering Targets Produced by Powder Metallurgy," Horizons of Powder Metallurgy Part I, Proceedings of the 1986 International Powder Metallurgy Conference and Exhibition, Jul. 7-11, 1986, pp. 219-222.
Stakheev, et al., "XPS and XAES Study of $TiO_2$-$SiO_2$ Mixed Oxide System", *J. Phys. Chem.* 1993, 97, pp. 5668-5672.
Stankova et al., "Thin (0 0 1) tungsten trioxide films grown by laser deposition," App. Surface Science 247 (2005), pp. 401-405.
Stumpp et al, "Manufacturing of Superclean Refractory and Reactive Metals and Alloys in High Vacuum for Advanced Technologies," 8th ICVM: Special Melting/Refining and Metallurgical Coating Under Vacuum or Controlled Atmosphere, vol. 2, Sep. 1985, pp. 1310-1324.
Su et al., "All Solid-State Smart Window of Electrodeposited $WO_3$ and $TiO_2$ Particulate Film With PTREFG Gel Electrolyte," J. Phys Chem Solids, vol. 59, No. 8, 1998, pp. 1175-1180.
"Surface Hardening of Ceramic and Glass Materials," *IBM Technical Disclosure Bulletin*, vol. 36, Issue 1 (Jan. 1993), p. 225.
"Surface Hardening of Ceramic and Glass Materials," *IBM Technical Disclosure Bulletin*, vol. 36, Issue 3 (Mar. 1993), pp. 291-292.
Szczyrbowski et al., "Properties of $TiO_2$—Layers Prepared by Medium Frequency and DC Reactive Sputtering," 1997 Soc. Of Vacuum Coaters (1997), pp. 237-241.
Tada et al., "Deactivation of the $TiO_2$ Photocatalyst by Coupling with $WO_3$ and the Electrochemically Assisted High Photocatalytic Activity of $WO_3$," Langmuir 20 (2004), pp. 4665-4670.
Takeuchi, et al., "Preparation of Titanium-Silicon Binary Oxide Thin Film Photocatalysts by an Ionized Cluster Beam Deposition Method. Their Photocatalytic Activity and Photoinduced Super-Hydrophilicity", *J. Phys. Chem.* 2003, 107, pp. 14278-14282.
Veersamy, et al., "Optical and Electronic Properties of Amorphous Diamond." *Diamond and Related Materials*, vol. 2 (1993), pp. 782-787.
Wachs et al., "Catalysis science of the solid acidity of model supported tungsten oxide catalysts," Catalysis Today 116 (2006), pp. 162-168.
Wilhartitz et al., "3D-SIMS analysis of ultra high purity molybdenum and tungsten: a characterisation of different manufacturing techniques," Fresenius J Anal Chem. (1995) 353: pp. 524-532.

Yamamoto et al., "Characteristics of Tungsten Gate Devices for MOS VLSI's," Materials Research Society, 1986, pp. 297-311.
Yamamoto et al., "Fabrication of Highly Reliable Tungsten Gate MOS VLSI's," J. Electrochem. Soc., vol. 133, No. 2, Feb. 1986, pp. 401-407.
Yamauchi et al., "Development of W-Ti Binary Alloy Sputtering Target and Study of its sputtering Characteristics," Nippon Tungsten Review, vol. 22 (1989), pp. 55-72.
Yoo et al., "Effects of annealing temperature and method on structural and optical properties of $TiO_2$ films prepared by RF magnetron sputtering at room temperature," App. Surface Science 253 (2007), pp. 3888-3892.
Yoon et al., "Growth kinetics and oxidation behavior of $WSi_2$ coating formed by chemical vapor deposition of Si on W substrate," J. Alloys and Compounds 420 (2006), pp. 199-206.
Yu et al., "The grain size and surface hydroxyl content of superhydrophilic $TiO_2$-$SiO_2$ composite nanometer thin films" *J. Mat. Sci. Lett*. (2001) 20, pp. 1745-1748.
Zanhai et al., "Preparation of W-Ti Sputtering Targets under Inert Atmosphere," Chinese Journal of Rare Metals, vol. 30, No. 5, 2006, Abstract.
Zanhai et al., "Tungsten-Titanium Targets and Manufacturing Technology," Chinese Journal of Rare Metals, vol. 30, No. 1, 2006, Abstract.
Zemen et al., "Self-cleaning and antifogging effects of $TiO_2$ films prepared by radio frequency magnetron sputtering," J. Vac. Sci. Technol. A, Mar./Apr. 2002, pp. 388-393.
International Preliminary Report on Patentability, dated Oct. 22, 2008 for PCT Application No. PCT/US2007/066685, 7 pages.
International Search Report and Written Opinion, dated Sep. 1, 2009 for PCT Application No. PCT/US2008/076183, 10 pages.
International Search Report and Written Opinion, dated Apr. 17, 2009 for PCT Application No. PCT/US2008/076157, 18 pages.
Hans-Joachim Becker et al., "Herstellung and Eigenschaften von Flachgläsern, die mittels Hochvakuum-zerstäubungsverfahrens beschichtet wurden" Magazine Silikattechnik 36 (1985) Issue 5.
Hans-Joachin Gläser, "Beschichtung groβflächiger Substratscheiben durch Kathodenzerstäubung" Glastechnische Berichte 56 (1983) No. 9.
Ion-Based Methods for Optical Thin Film Deposition (Journal of Material Science; J.P. Marting, 21 (1986) 1-25).
Vakuumbeschichtung 5 Anwendungen Teil II, VDI Verlag 1993, ISBN 3-18-401315-4.
English-language abstract for JP 2005-213585 (Konica Minolta).
English-language abstract for DE 39 06 453 (Leybold AG).
Spectrum Response of the Vacuum-Deposited $SiO_2$/$TiO_2$ Multilayer Film With Improved Photo-Catalytic Activity, *Journal of Materials Science Letters* 20, 2001, pp. 2137-2140.
Abstract—Japanese Patent Publication 4-276066.
Abstract—Japanese Patent Publication 5-214525.
Abstract—Japanese Patent Publication 6-330297.
Derwent Abstract 007612002 (Abstract of JP 879697).
Abstract Japanese Patent Publication 08158048A.

LOW-MAINTENANCE COATINGS

Matter enclosed in heavy brackets [ ] appears in the original patent but forms no part of this reissue specification; matter printed in italics indicates the additions made by reissue.

CROSS REFERENCE To RELATED APPLICATIONS

The present application claims priority to provisional U.S. patent application filed Jul. 12, 2004 and assigned Ser. No. 60/587,210, and provisional U.S. patent application filed Mar. 7, 2005 and assigned Ser. No. 60/659,491, the entire disclosures of which are incorporated herein by reference.

FIELD OF THE INVENTION

The present invention provides thin film coatings for glass sheets and other substrates. More particularly, the invention provides thin film coatings including a thin photocatalytic film, such as titania, deposited over a thin base layer, such as silica. The invention also provides methods of depositing such coatings onto glass sheets and other substrates.

BACKGROUND OF THE INVENTION

For many years, it has been known that titanium dioxide can be used as a photocatalyst. A great deal of research has been done with a view toward providing photocatalytic coatings that have self-cleaning properties. The pursuit of self-cleaning photocatalytic window coatings, in particular, has been an active field of exploration. Such coatings typically involve a titanium dioxide layer carried by a glass pane. These coatings are commonly provided with a relatively thick layer of titanium dioxide and/or a specific under-layer system designed for achieving high levels of photoactivity. Thick titanium dioxide layers, unfortunately, produce high levels of visible reflectance, thus creating a somewhat mirror-like appearance. This high visible reflection tends to exaggerate the appearance of dirt on a window. Further, known under-layer systems commonly teach that specific materials and crystal structures must be used for the under-layer film(s) to achieve acceptable photoactivity levels. Moreover, many photocatalytic coating systems teach that heating is required during or after film deposition to achieve acceptable levels of photoactivity.

Known photocatalytic coatings also tend to have properties that are less than ideal for applications in which the coatings are used on windows. As noted above, the visible reflectance of many known photocatalytic coatings is unacceptably high. Moreover, the reflected colors of these coatings tend not to be ideal. Further, some of these coatings have particularly high surface roughness, as they are designed to have large surface areas that facilitate high photoactivity levels. These rough coatings, unfortunately, tend to be quite vulnerable to being abraded. They are also particularly susceptible to taking on and stubbornly retaining dirt and other contaminants, due to their high surface roughness. Finally, with many recent photocatalytic coatings (e.g., those in which complex under-layer systems are used to maximize photoactivity), it is unclear whether these coatings will exhibit the longevity (e.g., in-field durability over time) that is required for number-one-surface coatings.

The present invention provides low-maintenance coatings that offer exceptional durability, exceptional optical properties, reliable production processes, and surprising cleanliness/maintenance properties.

SUMMARY OF THE INVENTION

In certain embodiments, the invention provides a low-maintenance coating on a glass sheet. The low-maintenance coating comprises a first film positioned directly over a first major surface of the glass sheet and a second film positioned directly over the first film. In various embodiments of the present invention, the first film includes a thin base film, (e.g. silica) that has a thickness of less than about 300 angstroms, alternatively less than about 150 angstroms, and further alternatively between about 70 angstroms and about 120 angstroms. The second film in various embodiments of the present invention includes a thin photocatalytic film (e.g. titania) that has a thickness of less than about 300 angstroms, alternatively less than about 150 angstroms, and further alternatively between about 30 angstroms and about 120 angstroms.

In other embodiments, the invention provides a method of depositing a low-maintenance coating. The method comprises depositing a low-maintenance coating on a glass sheet by depositing first film directly over a first major surface of the glass sheet and then depositing a second film directly over the first film. In one embodiment of the present invention, the first film comprises silica and is deposited at a thickness of between about 70 angstroms and about 120 angstroms. The second film comprises titania and is deposited at a thickness of between about 30 angstroms and about 120 angstroms. In some of these embodiments, both films are deposited by sputtering, preferably while maintaining the substrate at a low temperature (e.g., less than about 250 degrees Celsius, and preferably less than 200 degrees Celsius).

DETAILED DESCRIPTION OF PREFERRED EMBODIMENTS

Figure 1:
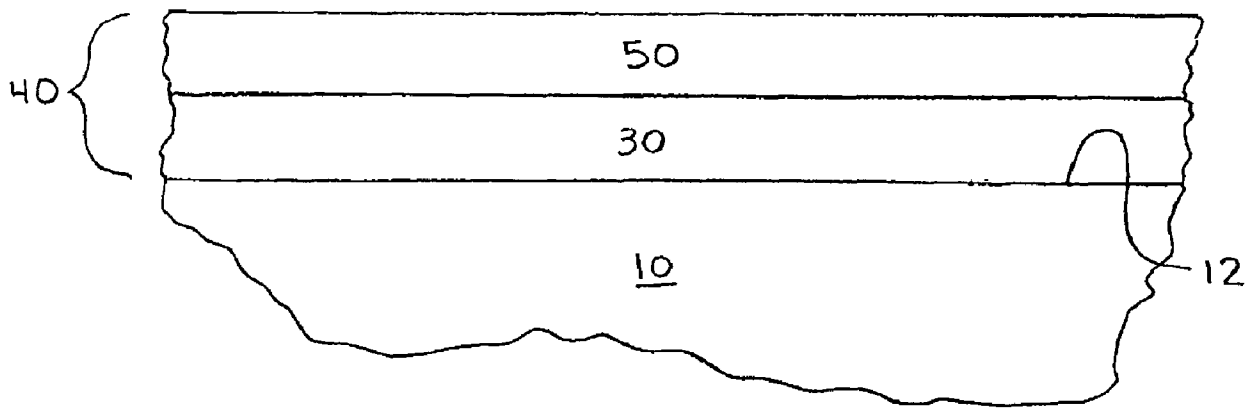
FIG. 1 is a partially broken-away schematic cross-sectional side view of a substrate bearing a low-maintenance coating in accordance with certain embodiments of the invention.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the given examples have many alternatives that fall within the scope of the invention.

In certain embodiments, the invention provides a substrate 10 bearing a low-maintenance coating 40. A variety of substrates are suitable for use in the invention. Preferably, the substrate 10 is a sheet-like substrate having generally or substantially opposed first 12 and second 14 major surfaces. In many embodiments, the substrate is a sheet of transparent material (i.e., a transparent sheet). The substrate, however, is not required to be transparent. For most applications, though, the substrate will comprise a transparent (or at least translucent) material, such as glass or clear plastic. For example, the substrate 10 is a glass sheet (e.g., a window pane) in preferred embodiments. A variety of known glass types can be used, and soda-lime glass is preferred.

Substrates of various sizes can be used in the present invention. Commonly, large-area substrates are used. Certain embodiments involve a substrate 10 having a width of at least about 0.5 meter, preferably at least about 1 meter, perhaps more preferably at least about 1.5 meters (e.g., between about 2 meters and about 4 meters), and in some cases at least about 3 meters.

Substrates of various thicknesses can be used in the present invention. Commonly, substrates (e.g., glass sheets) having a thickness of about 1-5 mm are used. Certain embodiments involve a substrate 10 with a thickness of between about 2.3 mm and about 4.8 mm, and perhaps more preferably between about 2.5 mm and about 4.8 mm. In some cases, a sheet of glass (e.g., soda-lime glass) with a thickness of about 3 mm will be used.

In certain embodiments, the invention provides a substrate 10 bearing a low-maintenance coating 40. The coating 40 is preferably deposited over (e.g., over an entirety of) a major surface 12 of the substrate 10. The low-maintenance coating 40 includes two films: (1) a first film 30 deposited over a major surface 12 of the substrate 10; and (2) a second film 50 deposited over the first film 30.

In various embodiments of the present invention, the first film 30 includes a base film, such as silica (e.g., silicon dioxide), and desirably is deposited directly over the substrate 10 (e.g., directly over a major surface 12 of the substrate). This film preferably consists of, or consists essentially of, silicon dioxide. The silica in the first film 30, however, can include small amounts of an electrically-conductive material, such as aluminum, which may be oxidized in the film 30. For example, this film 30 can be deposited by sputtering a silicon-containing target that includes a small amount of aluminum or another metal that enhances the electrical conductivity of the target. The first film 30 (an entire thickness of which may consist essentially of silica) desirably has (e.g., is deposited at) a physical thickness of less than about 300 angstroms, alternatively less than about 150 angstroms (e.g., between about 40 angstroms and about 150 angstroms), and further alternatively about 70 angstroms and about 120 angstroms. These incredibly small thicknesses facilitate a surprisingly array of exceptional properties in the present coating.

The coating 40 includes a second film 50 that includes a photocatalytic film, such as titania, and desirably is deposited directly over the first film 30. It is noted that one or more photocatalytic materials may be used in embodiments of the present invention including but not limited to oxides of titanium, iron, silver, copper, tungsten, aluminum, zinc, strontium, palladium, gold, platinum, nickel, cobalt and combinations thereof. In preferred embodiments, this film 50 consists of, or consists essentially of, titanium dioxide. In some embodiments though, the second film 50 consists of, or consists essentially of, substoichiometric titanium oxide ($TiO_x$, where x is less than 2). The second film 50 (an entire thickness of which may consist essentially of titania) desirably has (e.g., is deposited at) a physical thickness of less than about 300 angstroms, alternatively less than about 150 angstroms (e.g., between about 30 angstroms and about 150 angstroms), and further alternatively between about 30 angstroms and about 120 angstroms. It has been discovered that the second film 50 when provided at these incredibly small thicknesses, particularly when consisting essentially of titanium oxide and provided in combination with a first film consisting essentially of silicon dioxide at the noted thicknesses, provides unexpected maintenance properties (including exceptional characteristics in terms of taking on limited amounts of dirt and other contaminants and providing easy removal of those contaminants that do accumulate on the coating), while at the same time achieving exceptionally low visible reflection, neutral color, and exceptional durability. Moreover, in preferred embodiments, the second film is a sputtered film deposited at low temperatures (e.g., sputter deposited while maintaining the substrate at less than about 250 degrees Celsius and preferably less than 200 degrees Celsius), and it is especially surprising that a sputtered film of this nature exhibits such exceptional low-maintenance properties.

Certain particular embodiments provide a substrate 10 (e.g., a glass sheet) having a first major surface 12 directly over which is deposited a first film 30 consisting essentially of silica (e.g., $SiO_2$) at a thickness of between about 70 angstroms and about 120 angstroms, wherein a second film 50 consisting essentially of titania (e.g., $TiO_2$) is deposited directly over the first film 30 at a thickness of between about 30 angstroms and about 300 angstroms. In some preferred embodiments of this nature, the first film 30 has a thickness of between about 70 angstroms and about 120 angstroms, perhaps optimally about 100 angstroms, while the second film 50 has a thickness of between about 30 angstroms and about 120 angstroms, perhaps optimally about 100 angstroms.

In a further embodiment, the thickness of the second film 50 is less than 100 angstroms (and optionally less than about 80 angstroms) but greater than about 30 angstroms, while the first film 30 has a thickness of less than about 300 angstroms (and optionally less than about 100 angstroms) but greater than about 30 angstroms. In some cases of this nature, the first film consists essentially of silica while the second film consists essentially of titania.

In the present coating 40, the second film 50 desirably is the outermost film of the coating. Conventional wisdom in the art would suggest that the thin nature of the present coating 40 would not have enough photoactivity to give desirable self-cleaning properties, especially for embodiments where the second film 50 is sputtered, particularly while maintaining the substrate at a low temperature. Surprisingly, though, the present coating is incredibly effective in keeping windows (e.g., monolithic panes or IG units) free of the particular contaminants that build up on windows during the course of routine production. The present coatings also exhibit advantageous water-sheeting properties, while at the same time having exceptional optical properties and durability.

Figure 3:
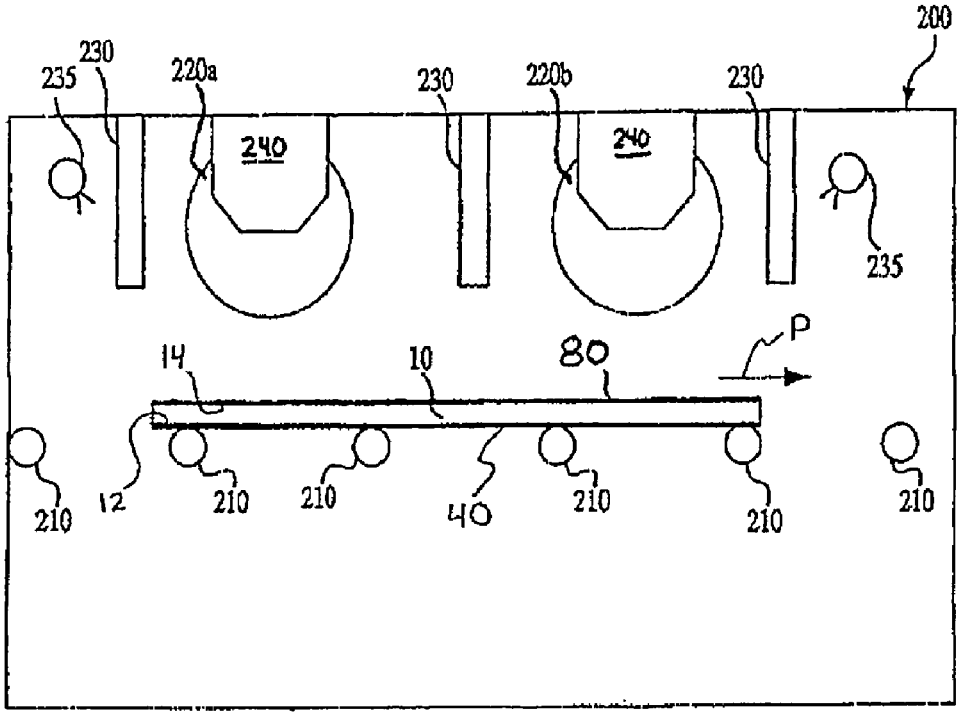
FIG. 3 is a schematic side end view of a sputtering chamber that is adapted for use in certain methods of the invention.

In FIG. 3, the illustrated substrate 10 is provided with two coatings: the low-maintenance coating 40 on the first surface 12 of the substrate and a low-emissivity coating 80 on the second surface 14 of the substrate. It is noted that, alternatively, in an insulating glass unit, the low-emissivity coating 80 may be positioned on the third surface of the insulated glass unit (the third surface is considered the surface of the second, e.g., inboard, pane that is exposed to the between-pane space of the insulated glass unit). The low-emissivity coating 80 is optional. When provided, any desired low-emissivity coating can be used. Suitable examples of a low-emissivity coating are described in U.S. patent application Ser. No. 09/728,435, entitled "Haze-Resistant Transparent Film Stacks", the entire teachings of which are incorporated herein by reference.

Figure 2:
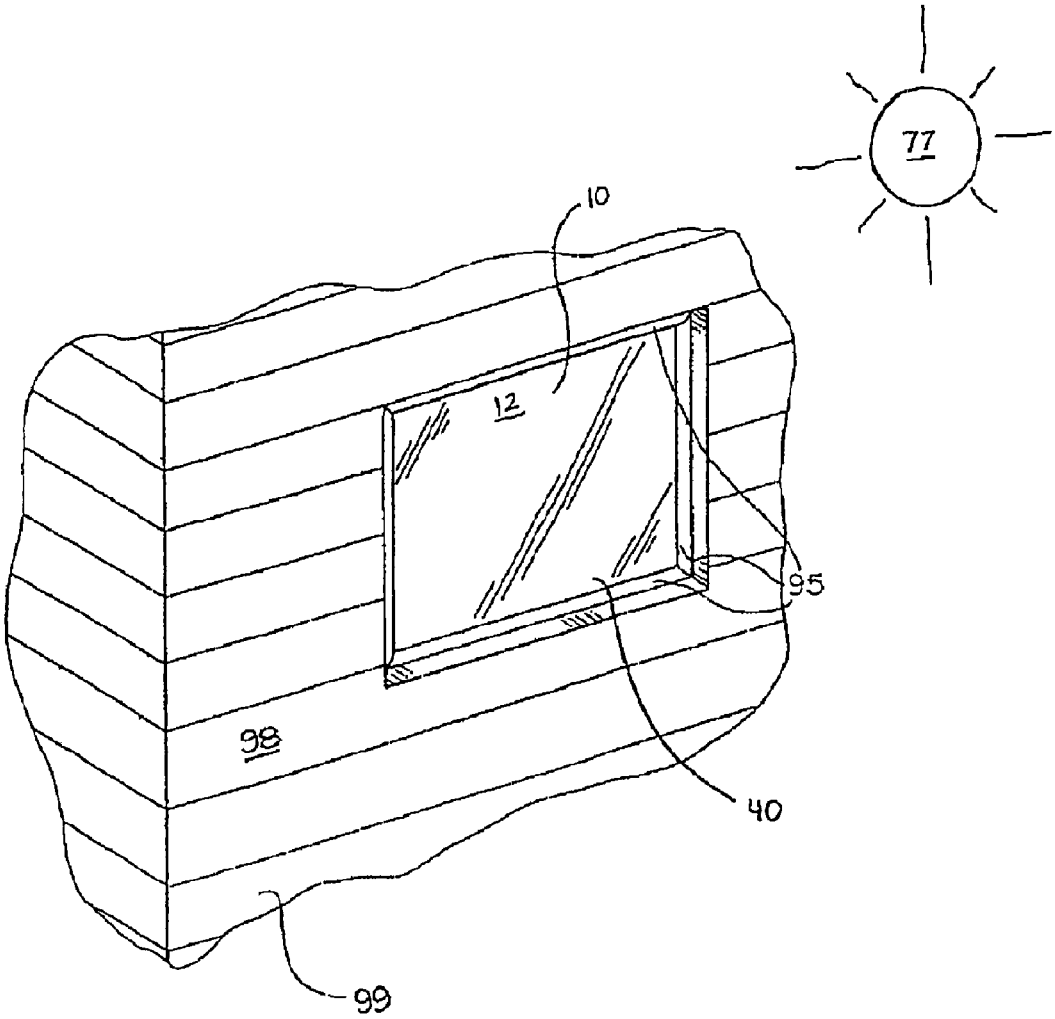
FIG. 2 is a partially broken-away perspective view of a window pane bearing a low-maintenance coating, the pane is mounted in an exterior wall of a building in accordance with certain embodiments of the invention.

With reference to FIG. 2, the low-maintenance coating 40 is preferably on the "first" surface of a window. This can be appreciated with reference to FIG. 2, which exemplifies embodiments wherein the substrate 10 (which may be a glass pane) is a window pane that is mounted on a window frame 95

(e.g., in an exterior wall 98 of a building 99). In certain applications, the coated first surface (i.e., the surface 12 on which the coating 40 is provided) of such a window will be exposed to an outdoor environment (e.g., such that the coating 40 will be in periodic contact with rain). In another embodiment, the low-maintenance coating is applied to the "fourth" surface of a window (e.g., the #4 surface of a double-pane window unit), optionally in addition to providing the low-maintenance coating 40 on the first surface of the same window. Further, in monolithic windows, the low-maintenance coating 40 can be provided on only the #1 surface, on only the #2 surface, or on both the #1 and #2 surfaces.

The invention also provides methods for producing coated substrates. These methods involve depositing a low-maintenance coating 40 (i.e., by depositing each film 30, 50 of any embodiment described above) upon a substrate 10. As noted above, the low-maintenance coating includes two films. These films 30, 50 can be deposited by a variety of well known coating techniques. In certain particularly preferred embodiments, the coating 40 (or at least the second film 50) is deposited by sputtering, preferably at a low temperature (e.g., while maintaining the substrate at below about 250 degrees Celsius, and more preferably below 200 degrees Celsius). However, other coating techniques, such as chemical vapor deposition (CVD), plasma enhanced chemical vapor deposition, and pyrolytic deposition can be used. Various embodiments of the coating 40 have been described, and the present methods involve depositing any of the described coating embodiments by any thin film deposition method, with sputtering being preferred, though not required, for at least the second film 50 and preferably for the whole coating 40.

Sputtering is well known in the present art. FIG. 3 depicts an exemplary magnetron sputtering chamber 200. Magnetron sputtering chambers and related equipment are commercially available from a variety of sources (e.g., Leybold). Useful magnetron sputtering techniques and equipment are described in U.S. Pat. No. 4,166,018, issued to Chapin, the entire teachings of which are incorporated herein by reference.

In preferred embodiments, the invention provides methods of producing a coated substrate by sputter depositing onto the substrate each film of any above-described coating embodiment. Preferably, the sputtering of the coating 40 (or at least the sputtering of the second film 50) is carried out while maintaining the substrate at a temperature of less than about 250 degrees Celsius, and more preferably less than 200 degrees Celsius (e.g., without heating the substrate).

In favored methods of the invention, the low-maintenance coating 40 is applied to a substrate 10 in a multiple-chamber sputtering line. Sputtering lines are well known in the present art. A typical sputtering line includes a series of sputtering chambers aligned and connected such that a sheet-like substrate can be passed from one chamber to the next by conveying the substrate horizontally over spaced-apart transport rollers 210 in each of the chambers (the rollers form a continuous path of substrate travel P through the sputtering line). The substrate is typically conveyed at speeds of between about 100-500 inches per minute.

In one particular method, the substrate 10 is positioned at the inlet of the sputtering line and conveyed to a desired coat zone. This coat zone is provided with three cathodes that are adapted to deposit the first film 30. In more detail, each of these cathodes comprises a silicon sputtering target. The silicon targets in this coat zone are sputtered in an oxidizing atmosphere to deposit a silicon dioxide film directly upon the first major surface 12 of the substrate. This atmosphere may consist essentially of oxygen (e.g., about 100% $O_2$). Alternatively, this atmosphere may comprise $Ar/O_2$ (e.g., oxygen and up to about 40% argon). A power of about 38 kW is applied to the first cathode, while a power of about 38 kW is applied to the second cathode, and a power of about 38 kW is applied to the third cathode. The substrate 10 is conveyed beneath all three of these targets at a rate of about 200 inches per minute, while sputtering each of these targets at the noted power level, such that a silicon dioxide film is applied at a thickness of about 100 Å. As noted above, each silicon target may include some aluminum or another material to enhance the conductivity of the target.

The thus coated substrate is then conveyed into a subsequent coat zone. In this zone, three cathodes are used to deposit the second film 50. Each of these three cathodes comprises a titanium sputtering target. The titanium targets in this coat zone are sputtered in an oxidizing atmosphere to deposit a titanium dioxide film directly upon the first film 30. This atmosphere may consist essentially of oxygen. Alternatively, this atmosphere may comprise $Ar/O_2$. A power of about 43 kW is applied to the first cathode, a power of about 43 kW is applied to the second cathode, and a power of about 43 kW is applied to the third cathode. The substrate 10 is conveyed beneath all three of these targets at a rate of about 200 inches per minute, while sputtering each of these targets at the noted power level, such that a titanium dioxide film is applied at a thickness of about 100 Å. This titanium dioxide forms the outermost portion (and is exposed) of the coating 40 in the present embodiment.

In the method just described, it is to be appreciated that the second major surface 14 of the substrate 10 may previously have been, or may subsequently be, coated with an optional low-emissivity coating 80. For instance, the coat zones just described for use in depositing the first 30 and second 50 films can be a sputter-up coat zones located toward the end of a sputtering line that includes a relatively large number of preceding sputter-down coat zones in which the optional low-emissivity coating 80 may have been applied. Particularly useful sputter-up/sputter-down methods and equipment are described in U.S. patent application Ser. No. 09/868,542, the entire contents of which are incorporated herein by reference.

While preferred embodiments of the present invention have been described, it should be understood that numerous changes, adaptations, and modifications can be made therein without departing from the spirit of the invention and the scope of the appended claims.

What is claimed is:

1. A low-maintenance coating on a glass sheet, the coating comprising a [first] *base* film positioned directly over a first major surface of the glass sheet and a [second] *photocatalytic* film positioned directly over the [first] *base* film, wherein the [first] *base* film [includes a base film and] has a thickness of less than about 100 angstroms, and wherein the [second film includes a] photocatalytic film [and] has a thickness of less than about 100 angstroms.

2. The low-maintenance coating of claim 1 wherein the base film is silica.

3. The low-maintenance coating of claim 2 wherein the coated first major surface is in periodic contact with rain.

4. The low-maintenance coating of claim 1 wherein the photocatalytic film is titania.

5. The low-maintenance coating of claim 1 wherein the thickness of the [first] *base* film is between about 70 angstroms and about 100 angstroms.

6. The low-maintenance coating of claim 1 wherein the thickness of the [second] *photocatalytic* film is between about 30 angstroms and about [120] *100* angstroms.

7. The low-maintenance coating of claim 1 wherein the glass sheet is a window pane mounted in a window frame, and wherein the coated first major surface is exposed to an outdoor environment.

8. The low-maintenance coating of claim 1 wherein the [first] *base* film consists essentially of silica and the [second] *photocatalytic* film consists essentially of titania.

9. The low-maintenance coating of claim 8 wherein the silica is silicon dioxide, and the titania is titanium dioxide or substoichiometric titanium oxide.

10. The low-maintenance coating of claim 1 wherein the [first] *base* and [second] *photocatalytic* films are both sputtered films.

11. A low-maintenance coating on a glass sheet, the coating comprising a first film positioned directly over a first major surface of the glass sheet and a second film positioned directly over the first film, wherein the first film consists essentially of silica and has a thickness of between about 30 angstroms and about 100 angstroms, and wherein the second film consists essentially of titania and has a thickness of less than 100 angstroms but greater than about 30 angstroms.

12. The low-maintenance coating of claim 11 wherein the second film has a thickness of less than about 80 angstroms.

*13. The low-maintenance coating of claim 11 wherein the silica of the first film contains aluminum oxide.*

*14. The low-maintenance coating of claim 11 wherein the silica of the first film includes an electrically conductive material present in oxidized form.*

*15. The low-maintenance coating of claim 14 wherein the second film is an outermost film of the coating.*

*16. The low-maintenance coating of claim 2 wherein the base film further comprises an oxidized electrically conductive material.*

*17. The low-maintenance coating of claim 16 wherein the electrically conductive material is aluminum.*

*18. The low-maintenance coating of claim 8 wherein the base film has a thickness of between about 70 angstroms and about 100 angstroms, and the photocatalytic film has a thickness of between about 30 angstroms and about 100 angstroms.*

*19. A low-maintenance coating on a substrate, the coating comprising a base film extending directly from a first major surface of the substrate to a thickness of less than about 100 angstroms, and a photocatalytic film extending directly from a surface of the base film to a thickness of less than about 100 angstroms.*

*20. The low-maintenance coating of claim 19 wherein the base film consists essentially of silica and the photocatalytic film consists essentially of titania.*

*21. The low-maintenance coating of claim 19 wherein the base and photocatalytic films are both sputtered films.*

*22. The low-maintenance coating of claim 19 wherein the base film extends directly from the first major surface of the substrate to a thickness of between about 70 angstroms and about 100 angstroms, and the photocatalytic film extends directly from the surface of the base film to a thickness of between about 30 angstroms and about 100 angstroms.*

* * * * *